United States Patent [19]

Sarkozy

[11] Patent Number: 4,793,283

[45] Date of Patent: Dec. 27, 1988

[54] APPARATUS FOR CHEMICAL VAPOR DEPOSITION WITH CLEAN EFFLUENT AND IMPROVED PRODUCT YIELD

[76] Inventor: Robert F. Sarkozy, 85 Concord Rd., Westford, Mass. 01886

[21] Appl. No.: 131,475

[22] Filed: Dec. 10, 1987

[51] Int. Cl.⁴ .............................................. C23C 16/52
[52] U.S. Cl. .................................... 118/725; 118/715; 118/728
[58] Field of Search .................... 118/715, 728, 725

[56] References Cited

U.S. PATENT DOCUMENTS

| | | | |
|---|---|---|---|
| 4,018,184 | 4/1977 | Nagasawa et al. | 118/500 X |
| 4,108,106 | 8/1978 | Dozier | 427/82 X |
| 4,232,063 | 11/1980 | Rosler et al. | 427/94 |
| 4,315,479 | 2/1982 | Toole et al. | 118/726 |
| 4,501,777 | 2/1985 | Rose | 427/255 |
| 4,608,063 | 8/1986 | Kurokawa | 55/208 |
| 4,615,909 | 10/1986 | Thijssen et al. | 427/82 |

Primary Examiner—Evan Lawrence

Attorney, Agent, or Firm—Pollock, Vande Sande & Priddy

[57] ABSTRACT

A system for chemical vapor deposition of a material onto the surface of a substrate wherein an inner reactor tube is disposed within an outer furnace tube to provide a plenum chamber between the two tubes. The reactor tube is provided with a series of axially arranged openings to provide gas communication between the inside of the reactor tube and the plenum chamber. Structure is provided for introducing a first reactant gas into the plenum chamber from which a portion passes into the reactor chamber and structure is provided for introducing a second reactant gas directly into the reactor chamber, where a portion reacts with the first reactant gas to deposit a layer of material on substrates present in the reactor chamber. Separate lines are provided for exhausting unreacted first reactant gases from the plenum chamber and for exhausting unreacted second reactant gases from the reaction chamber.

6 Claims, 2 Drawing Sheets

APPARATUS FOR CHEMICAL VAPOR DEPOSITION WITH CLEAN EFFLUENT AND IMPROVED PRODUCT YIELD

BACKGROUND OF THE INVENTION

1. Field of the Invention

This invention relates to systems for the chemical vapor deposition of material onto the surfaces of substrates, and more particularly, to a low pressure chemical vapor deposition system having improved means for distributing reactant gases to the substrates and independently evacuating unreacted gases from plenum zones containing substrates to be coated.

2. Prior Art

In one process for making semiconductor substrates (wafers) to be fabricated into integrated circuits (chips), thin films of selected composition and characteristics are deposited onto batches of substrates by chemical vapor deposition at low pressure. Wafers are typically vertically oriented in a batch of 100-200, held in close parallel array supported by slotted quartz rods. The batch is typically removably, concentrically positioned within a longitudinally extending quartz tube reaction chamber which is maintained at a precise temperature and vacuum specific to the chemistry required for the particular thin film product to be deposited.

Vacuum is maintained in the reaction chamber by a mechanical vacuum pump connected to the exhaust end of the system. Two streams of reactants are typically injected into the other (the load) end of the chamber, one stream typically comprised of gases or vapors to provide the cation portion of the deposited thin film as well as dopant cations, the second stream typically comprised of a mixture of gases or vapors to provide the anion portion of the deposited thin film material and dopants.

The injected gases and vapors intermix and flow from the load end points of injection longitudinally along the length of the reaction chamber due to a pressure differential set up by the mechanical vacuum pump. After traveling the length of the chamber, the mixture of gases exits at the exhaust end and flows to the mechanical vacuum pump. During this process, the primary flow path of the constituents of the injected gases or vapors is within the circumferential zone between the inner walls of the reaction chamber and the outer edge of the load of semiconductor substrates. From this primary flow region constituents of the primary stream diffuse perpendicularly into the open spaces between individual substrates and a surface-catalyzed reaction results in a deposit of the desired film onto the substrate surfaces.

Typically, the efficiency of the system is only 15-25%, so that 75-85% of the injected gases and vapors travel along the primary flow path as described above and exit the reactor (as a mixture) to enter the vacuum exhaust line and the mechanical vacuum pump. The exhaust gases and vapors continue to react in the exaust line and vacuum pump, depositing material along the flow pathway. The deposited material is typically in the form of abrasive particles and powdery dusts. In addition, large flakes or chunks of deposited material dislodge from the inner walls of the vacuum exhaust line and are pulled into the mechanical vacuum pump. The large chunks and abrasive particles quickly initiate mechanical abrasion of the internal pump components, thus leading to rapid pump wear-out and failure. The powdery dusts mix with the pump fluid to form a heavy paste that precipitates and blocks fluid flow passages and thus prevents proper pump lubrication. This leads to premature bearing wear and ultimately to freezing of the pump.

Replacement of vacuum pumps is very costly. The pump itself represents an expense, but even more costly is the down-time on the system. The time to reduce the power, remove the failed pump and install a new or rebuilt one, increase the power and requalify the process may take 1-2 operating shifts. In this time, thousands of wafers in process may be delayed, which results in a similar lost time for the equipment performing the next sequential process operation. Vacuum pump replacement is also a very dirty process, and is thus not compatible with the clean room operation of the deposition process.

A trap may be inserted between the pump and the deposition system to help protect the vacuum pump. However, the trap has an adverse effect on the system because its flow properties change constantly as solids are added to it. This leads to a difficulty in controlling the reaction chamber pressure, which in turn leads to difficulty in controlling the deposition process. Furthermore, accumulated material in the trap may find its way back into the reaction chamber due to backstreaming during evacuation and venting cycles and thus contaminate substrate material. This contamination reduces the yield and results in a very costly loss of product. Finally, the trap is often messy and sometimes dangerous to clean out due to the nature of the materials which are dealt with.

Another protective measure which may be used is a step of circulating and filtering the pump fluid with an external filtration system. However, this step is of only limited value since the destructive material is already in the pump and the filtration system can only remove that portion which stays suspended in the fluid, and damage is inflicted by that portion which precipitates out onto the internal pump hardware.

Finally, accumulated material in the exhaust hardware finds its way back into the system reaction chamber during evacuation and vent cycles, contaminates substrates, and results in lowered product yields.

SUMMARY OF THE INVENTION

It is accordingly one object of this invention to provide an improved system for the chemical vapor deposition of material onto substrates.

It is another object of this invention to provide a chemical vapor deposition system having an improved gas injection and gas evacuation means.

It is still another object of this invention to provide a system for the chemical vapor deposition of a material onto surfaces of a plurality of wafers in which at least two reactant gases are separately introduced into a reactant zone containing the wafers.

It is yet another object of this invention to provide a plating system for the chemical vapor deposition of a film onto the surface of a substrate which includes means for separately introducing the cation and anion portion of the film to the zone containing the substrate and means for separately evacuating the unreacted portion of the cation and anion contributing reactants from the plating system.

It is still another objective of this invention to provide a chemical vapor deposition process with minimum contamination of both substrate material and exhaust hardware by means of controlled and thus limited mixing of reactant gases and vapors, with independent exhaust of unreacted material.

In accordance with the invention, there is provided a system for the chemical vapor deposition of a film onto the surface of a plurality of substrates comprising a furnace tube, and a reactor tube arranged within the furnace tube to provide a plenum chamber between the furnace tube and the reactor tube. The reactor tube is provided with a reduced cross-section exhaust end, an open end and a plurality of axially spaced openings for the flow of gases from the plenum chamber into the reactor tube. Means are provided for introducing a first reactant gas into the plenum chamber and separate means are provided for introducing a second reactant gas into the reactor tube. First and second gas exhaust means are provided for separately removing unreacted portions of the first and second reactant gases from the plenum chamber and the reactor tube, respectively.

This invention keeps reactant gases separate from each other until they reach the vicinity of the substrates, and excess reactant gases are removed in separate streams through two distinct vacuum systems, thereby minimizing the formation of reaction products in regions outside the zone containing the substrates.

DETAILED DESCRIPTION OF THE INVENTION

Figure 1:
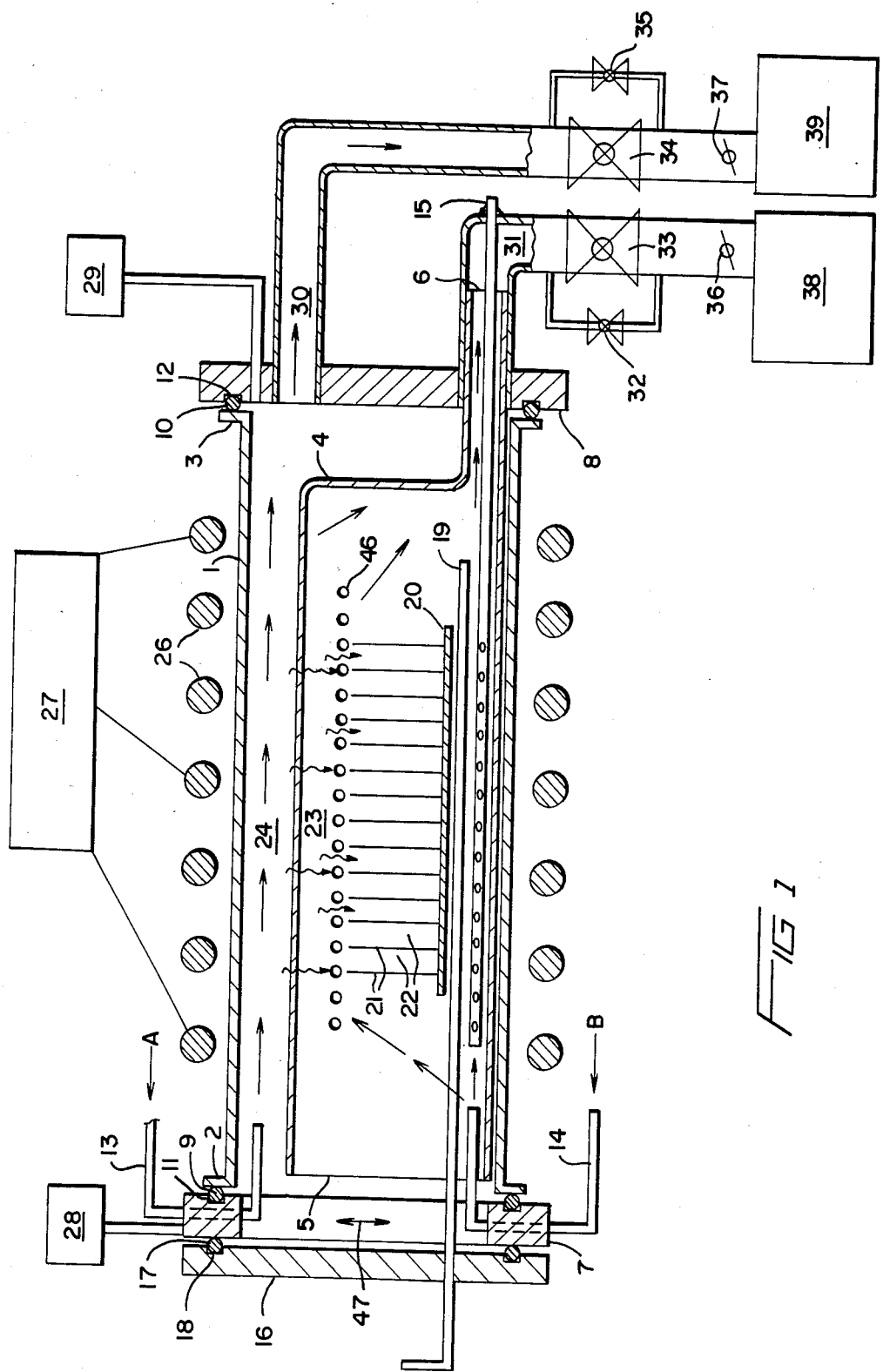
FIG. 1 is a longitudinal view in cross-section of the system in accordance with the present invention.

FIG. 1 illustrates the system and method for depositing thin film materials of selected composition and properties onto semiconductor substrates for the fabrication of integrated circuits by means of low pressure chemical vapor deposition. During use, the system separately and independently removes the large amounts (75-85%) of unreacted injected gases and vapors characteristic of such systems by means of multiple mechanical vacuum pumps, thus eliminating mixing and subsequent reaction of such gases and vapors within the vacuum exhaust lines and mechanical vacuum pump with the resultant rapid degradation and failure of the pump hardware.

In addition to vacuum hardware protection, the controlled mixing of reactants in the reaction chamber and the elimination of reaction in the downstream and exhaust regions minimizes particulate and chemical contamination of substrates, thus providing maximum yields. The system includes a horizontal furnace tube 1 which is fabricated from a suitable high temperature material such as quartz. A second horizontal reactor tube 4, whose outer diameter is slightly smaller than the inner diameter of the furnace, i.e., 7 inches to 11 inches for a furnace tube 8 to 12 inches in diameter, rests along the bottom of the furnace tube 1. The wall of the furnace tube and the wall of the reactor tube form plenum chamber 24. Reactor tube 4 is fully open at end 5 for the insertion and removal of substrates, and is necked down to an exhaust port 6 for connection to a vacuum source at the other end. Furnace tube 1 is fully open at both ends, with integral quartz flanges 2 and 3 for effecting a vacuum seal at annular ring 7 and end closure plate 8.

The reactor tube has four rows of openings 46. Circular openings are shown since they are easy to fabricate with silicon carbide or diamond impregnated drills to provide paths for gas flow from the plenum chamber to the inner chamber; however, the shape is not critical and other shapes may be used. These openings typically may be of the order of ⅛ inch in diameter, located on approximately 1 inch centers, and cover a linear distance about equal in length to the temperature-controlled ("flat") zone of the system. As shown, the four rows are located symmetrically around the circumference of the chamber at 90° intervals.

Figure 2:
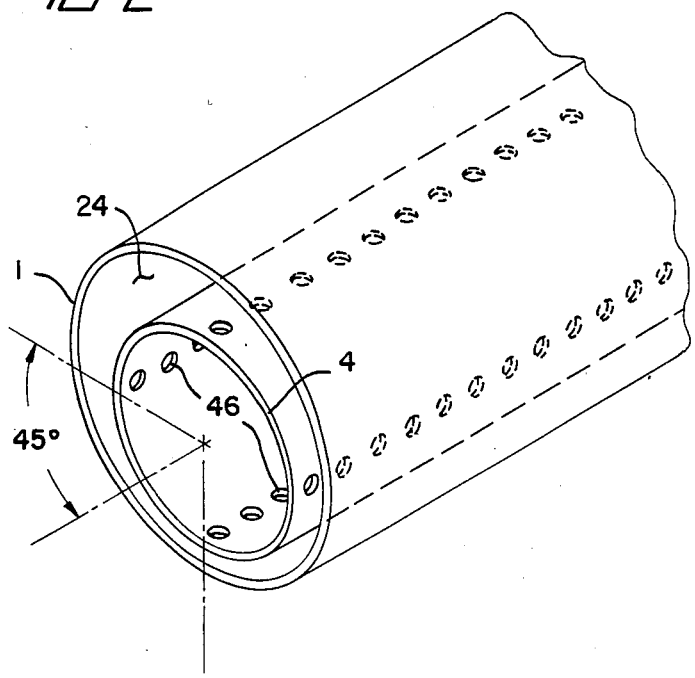
FIG. 2 is a view in perspective showing the relationship between the furnace tube 1, reaction tube 4 and holes in the reactor tube.

The inner reactor tube 4 is also fabricated from a suitable high temperature material such as quartz. The relative orientation of the two horizontal tubular chambers and the pattern of circular openings through the walls of the inner chamber of FIG. 1 are illustrated in FIG. 2.

The furnace tube is provided with resistance heater 26 which is coiled around the system with suitable insulation. Heater 26 is powered and controlled by a control system 27 which is fed information by control thermocouples (not shown) at various locations within the reactor tube and the heater coil insulation. Annular ring 7 and closure plate 8, fabricated from a suitable material such as stainless steel, are used to seal off the ends of the furnace tube. Seals made with O-rings 9 and 10 are fabricated from a suitable material such as silicone rubber, and are held in place by machined grooves 11 and 12 in ring 7 and closure 8. A mechanical latching assembly (not shown) holds ring 7 and closure 8 in physical contact with O-rings 9 and 10 when the system is not under vacuum. The quartz flanges 2 and 3 of furnace tube 1 provide the mating surfaces for the O-ring seals. Ring 7 has a central circular aperture 47 of sufficient size for the insertion and removal of a load of semiconductor substrate (wafers) 21.

The substrates 21 are vertically oriented on a boat 20 constructed of a suitable material such as quartz or silicon carbide. The boat rests on paddle assembly 19 constructed of a suitable material such as quartz, silicon carbide or alumina. Although a cantilevered version is illustrated, the paddle assembly may be of the wheelbarrow or rolling carriage/cart/truck type. The aperture 47 is closed and sealed by a movable door 16 provided with an O-ring 17 held in place by machined groove 18. The movement of the door assembly 16 is controlled by means of a mechanical arm and track assembly (not shown).

End closure plate 8 is provided with two vacuum exhaust lines 30 and 31, fabricated from a suitable material such as stainless steel, connected to mechanical vacuum pumps 38 and 39. Vacuum to the system is turned on and off by vacuum valves 32, 33, 34 and 35, which separate the vacuum pumps from the two chambers. The smaller bypass valves 32 and 34 are used for "soft-pumping" the system prior to opening the primary valves 33 and 35. Vacuum is monitored with suitable vacuum gauges 28 and 29.

Reactant gas or vapor streams A and B are injected into chambers within tubes 1 and 4, respectively, by means of injectors 13, 14 and 15.

Figure 3:
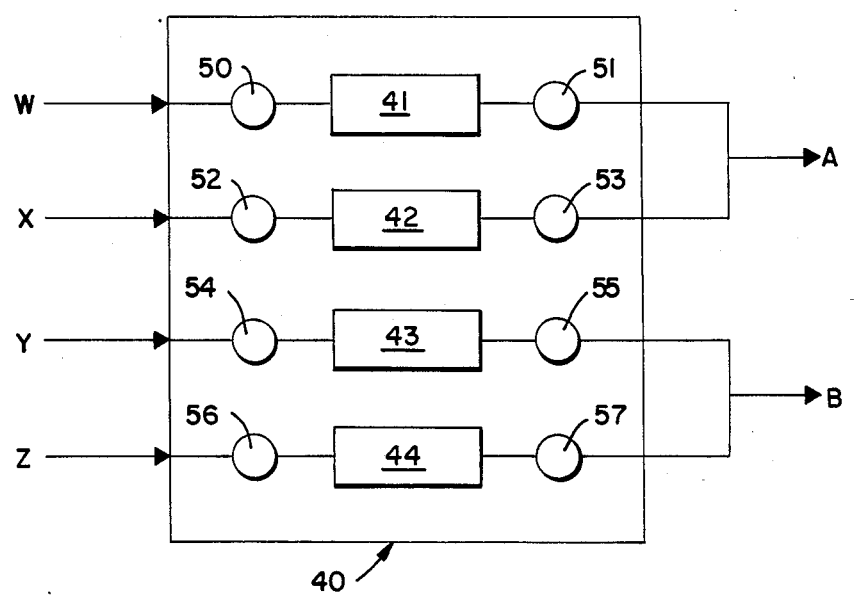
FIG. 3 is a schematic diagram of a system for controlling the flow of reactant gases.

Gas or vapor streams A and B are metered and controlled by gas control system 40, shown in FIG. 3, comprised of mass flow controllers 41–44 and on-off valves 50–57. This hardware, along with control electronics (not shown) provide precise mixing and flow control of gases or vapors W, X, Y and Z.

During a typical operation, gas control system 40 meters predetermined amounts of reactants W, X, Y and Z in the form of gas or vapor streams A and B into plenum chamber 24 and reactor 4, respectively, with vacuum valves 33 and 35 open to maintain the system at a predetermined pressure such as, for example, 200-1500 millitorr. Exact pressure is maintained both by the volumes of A and B which are injected and by the operation of suitable control valves 36, 37, which may be, for example, of the mechanical butterfly type. Gas or vapor stream A is swept through the plenum chamber 24 along the longitudinal axis of the system by the pressure differential provided by the mechanical vacuum pump 39. The primary flow path is the circumferential plenum chamber 24 between the inner wall of the furnace tube 1 and the outer wall of reactor tube 4. From this plenum chamber, constituents of A diffuse through the rows of openings 46 in the walls of the reactor 4 and enter into the primary flow stream of gas B, from which they diffuse perpendicularly into the open spaces 22 between substrates 21. Simultaneously, gas or vapor stream B is being swept through the inner chamber of reactor 4 along the longitudinal axis of the system by the pressure differential provided by the activity of mechanical vacuum pump 38. The primary flow path for gas B is the circumferential region 23 along the inner wall of the inner reaction chamber 4. From this primary flow region, constituents of B diffuse perpendicularly into the open spaces 22 between substrates 21. Constituents of A and B thus mix in the open spaces 22 between substrates 21, and a surface-catalyzed reaction provides the predetermined thin film, controlled by the composition and flow of A and B, the controlled temperature and the controlled pressure.

With equal pumping speeds on the plenum chamber 24 and reactor 4, the constituents of flow stream B would diffuse from the primary flow region 23, through the openings 46 in the walls of reactor tube 4, into the primary flow region 24 of flow stream A in plenum chamber 24. Such a reverse diffusion is undesirable and to prevent it, the desired diffusion of constituents of A in plenum chamber 24 into the primary flow region 23 of flow stream B in inner (reaction) chamber 4, and ultimately into the open spaces 22 between substrates 21, is assisted by the creation of a small pressure differential between the two chambers 1 and 4.

This pressure differential is created by the use of the control valves 36 and 37, providing the inner (reaction) chamber 4 with a slightly higher pumping rate than the outer chamber 1.

In a typical process, the majority of the constituents comprising gas or vapor stream A (75-85%) travel along the primary flow path in plenum 24, and are exhausted, unmixed with the constituents of flow stream B, through exhaust line 30 and into mechanical vacuum pump 39. The majority of the constituents comprising gas or vapor stream B (75-85%) travel along the primary flow path in region 23 in inner chamber 4, and are exhausted, unmixed with the constituents comprising flow stream A, through exhaust line 31 and into mechanical vacuum pump 38. The constituents of flow streams A and B, traveling through separate and independent vacuum pumps, typically are swept through the pumps (still in the form of gases or vapors), and are discharged through the pump exhaust stacks without causing any damage to the pumps or associated hardware.

Process control is effected by the amount of mixing of flow streams A and B in reaction chamber 4 which is determined by the relative pumping rates on chambers 1 and 4, which is controlled by throttle valves 36 and 37.

This invention is not limited to the embodiment described above, and many variations are possible to those skilled in the art without departing from the scope of the invention. For example, the furnace tube 1 and the reactor tube 4 have been shown as having a circular cross-section but they may have a different cross-section; the reactor tube is shown as resting on the bottom of the furnace tube, but it may be mounted coaxially with the furnace tube or even mounted so that the upper portion of the wall is in contact with the furnace tube. Other non-horizontal (i.e., vertical, symmetrical, etc.) geometries may be engineered to provide the same controlled gas mixing with independent exhaust of the unmixed and thus unreacted species as herein described.

What is claimed is:

1. A system for the chemical vapor deposition of a film onto surfaces of a plurality of substrates comprising:
   (a) a furnace tube;
   (b) a reactor tube arranged inside furnace tube to provide a plenum chamber between the outer surface of said reactor tube and the inner surface of said furnace tube, said reactor tube having a reduced cross-section exhaust end, an open end, and a plurality of axially spaced openings;
   (c) means for introducing a plurality of said substrates into said reactor tube through said open end;
   (d) means for introducing a stream of first reactant gas into said plenum chamber;
   (e) means for controlling gas pressures in said plenum chamber and in said reactor tube to cause a portion of said first reactant gas to flow from said plenum chamber through said axially spaced openings into said reactor tube;
   (f) first gas exhaust means for removing said first reactant gas from said plenum chamber;
   (g) means for separately introducing a stream of a second reactant gas into said reactor tube; and
   (h) second gas exhaust means for removing said second reactant gas from said reactor tube.

2. A system in accordance with claim 1 wherein said reactor tube is asymmetrically disposed within said furnace tube.

3. A system in accordance with claim 1 wherein said openings in said reactor tube are disposed in a plurality of rows.

4. A system in accordance with claim 1 wherein said first gas exhaust means is adapted to remove said first reactant gas from a zone near said exhaust end of said reactor tube.

5. A system in accordance with claim 1 wherein said first gas exhaust means comprises a mechanical vacuum pump.

6. A system in accordance with claim 1 wherein said second gas exhaust means comprises a mechanical vacuum pump.

* * * * *